(12) United States Patent
Mirichigni et al.

(10) Patent No.: US 11,749,316 B2
(45) Date of Patent: *Sep. 5, 2023

(54) PROVIDING POWER AVAILABILITY INFORMATION TO MEMORY

(71) Applicant: Micron Technology, Inc., Boise, ID (US)

(72) Inventors: Graziano Mirichigni, Vimercate (IT); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/671,000

(22) Filed: Feb. 14, 2022

(65) Prior Publication Data

US 2022/0172750 A1 Jun. 2, 2022

Related U.S. Application Data

(60) Continuation of application No. 17/062,202, filed on Oct. 2, 2020, now Pat. No. 11,250,889, which is a
(Continued)

(51) Int. Cl.
*G11C 7/00* (2006.01)
*G11C 5/14* (2006.01)
(Continued)

(52) U.S. Cl.
CPC .......... *G11C 5/144* (2013.01); *G06F 13/1668* (2013.01); *G11C 5/14* (2013.01);
(Continued)

(58) Field of Classification Search
CPC ..................................................... G11C 5/144
(Continued)

(56) References Cited

U.S. PATENT DOCUMENTS 5,511,204 A 4/1996 Crump et al.
5,594,360 A 1/1997 Wojciechowski
(Continued)

FOREIGN PATENT DOCUMENTS

CN 103733179 A 4/2014
EP 1306741 A2 2/2003
(Continued)

OTHER PUBLICATIONS

International Search Report and Written Opinion from related international application No. PCT/US2015/030786, dated Aug. 13, 2015, 15 pages.
(Continued)

*Primary Examiner* — Hoai V Ho
(74) *Attorney, Agent, or Firm* — Brooks, Cameron & Huebsch, PLLC

(57) ABSTRACT

The present disclosure includes apparatuses and methods for providing power availability information to memory. A number of embodiments include a memory and a controller. The controller is configured to provide power and power availability information to the memory, and the memory is configured to determine whether to adjust its operation based, at least in part, on the power availability information.

17 Claims, 2 Drawing Sheets

Related U.S. Application Data continuation of application No. 16/513,115, filed on Jul. 16, 2019, now Pat. No. 10,796,731, which is a continuation of application No. 15/843,195, filed on Dec. 15, 2017, now Pat. No. 10,424,347, which is a continuation of application No. 15/434,748, filed on Feb. 16, 2017, now Pat. No. 9,905,275, which is a continuation of application No. 15/090,870, filed on Apr. 5, 2016, now Pat. No. 9,607,665, which is a division of application No. 14/288,618, filed on May 28, 2014, now Pat. No. 9,343,116.

(51) Int. Cl.
*G06F 13/16* (2006.01)
*G11C 11/4072* (2006.01)
*G11C 11/4074* (2006.01)
*G11C 16/30* (2006.01)

(52) U.S. Cl.
CPC .......... *G11C 5/142* (2013.01); *G11C 11/4072* (2013.01); *G11C 11/4074* (2013.01); *G11C 16/30* (2013.01); *Y02D 10/00* (2018.01)

(58) Field of Classification Search
USPC .......................................................... 365/277
See application file for complete search history.

(56) References Cited

U.S. PATENT DOCUMENTS

| | | | |
|---|---|---|---|
| 7,895,454 B2 | 2/2011 | Singh | |
| 7,996,580 B2 | 8/2011 | Rave et al. | |
| 8,175,528 B2* | 5/2012 | He | H04W 12/069 455/41.1 |
| 8,230,239 B2 | 7/2012 | Wang et al. | |
| 8,504,759 B2 | 8/2013 | Villa et al. | |
| 8,797,170 B2 | 8/2014 | Cho | |
| 9,343,116 B2 | 5/2016 | Mirichigni et al. | |
| 9,607,665 B2 | 3/2017 | Mirichigni et al. | |
| 9,881,653 B2 | 1/2018 | Ling et al. | |
| 9,905,275 B2 | 2/2018 | Mirichigni et al. | |
| 10,424,347 B2 | 9/2019 | Mirichigni et al. | |
| 10,796,731 B2 | 10/2020 | Mirichigni et al. | |
| 2005/0055591 A1 | 3/2005 | Cho | |
| 2005/0117418 A1 | 6/2005 | Jewell et al. | |
| 2005/0160316 A1 | 7/2005 | Shipton | |
| 2006/0248355 A1 | 11/2006 | Thayer | |
| 2008/0040562 A1 | 2/2008 | Gower et al. | |
| 2008/0091965 A1 | 4/2008 | Nychka et al. | |
| 2009/0019243 A1 | 1/2009 | Hur et al. | |
| 2009/0292934 A1 | 11/2009 | Esliger | |
| 2011/0066872 A1 | 3/2011 | Miller et al. | |
| 2011/0173462 A1 | 7/2011 | Wakrat et al. | |
| 2013/0024712 A1 | 1/2013 | Akagi et al. | |
| 2013/0290606 A1 | 10/2013 | Messi et al. | |
| 2013/0311801 A1 | 11/2013 | Kong et al. | |
| 2013/0336067 A1 | 12/2013 | Tanaka et al. | |
| 2014/0112079 A1 | 4/2014 | Wakrat et al. | |
| 2014/0285033 A1 | 9/2014 | Jantunen et al. | |

FOREIGN PATENT DOCUMENTS

| | | | |
|---|---|---|---|
| JP | H11296627 A | 10/1999 | |
| JP | 2004206409 A | 7/2004 | |
| JP | 2006195901 A | 7/2006 | |
| JP | 2012523052 A | 9/2012 | |
| JP | 2013025786 A | 2/2013 | |
| JP | 2013239178 A | 11/2013 | |
| JP | 2015531531 A | 11/2015 | |
| KR | 10-2009-0059659 A | 6/2009 | |
| KR | 10-2013-0127746 A | 11/2013 | |
| WO | 2014039716 A1 | 3/2014 | |

OTHER PUBLICATIONS

Supplementary European Search Report from related European patent application No. 15800213.9, dated Nov. 30, 2017, 10 pages.
"Embedded Multimedia Card (eMMC), Electrical Standard 4.51", JEDEC Solid State Technology Association, Jun. 2012, 264 pages.
Notice of Reasons for Rejection from related Korean patent application No. 10-2016-7035634, dated Dec. 21, 2017, 10 pages.
Notice of Rejection from related Japanese patent application No. 2017-513586, dated Dec. 19, 2017, 11 pages.
Office Action from related Chinese patent application No. 201580028169.0, dated May 28, 2018, 27 pages.
Communication pursuant to Article 94(3) EPC from related European patent application No. 15800213.9, dated Sep. 26, 2018, 7 pages.
S-W Radio "Lighting Lamp", Short Wave and Television, Aug. 1937, 1 page.
Notice of Reasons for Rejection from related Korean patent application No. 10-2018-7025592, dated Nov. 14, 2018, 7 pages.
Notice of Rejection Ground from related Japanese patent application No. 2018-072982, dated Jan. 24, 2019, 8 pages.
Jedec Standard, "Embedded Multimedia Card (e-MMC), Electrical Standard 4.51", JEDEC Solid State Technology Association, Arlington, VA, Jun. 2012, 264 pages.
European Search Report from related European patent application No. 19170778.5, dated Jul. 12, 2019, 4 pages.
Communication pursuant to Article 94(3) EPC from related European patent application No. 19170778.5, dated Aug. 8, 2019, 9 pages.

* cited by examiner

PROVIDING POWER AVAILABILITY INFORMATION TO MEMORY

PRIORITY INFORMATION

This application is a Continuation of U.S. application Ser. No. 17/062,202, filed on Oct. 2, 2020, which will issue as U.S. Pat. No. 11,250,889 on Feb. 15, 2022, which is a Continuation of U.S. application Ser. No. 16/513,115, filed on Jul. 16, 2019, now issued as U.S. Pat. No. 10,796,731 on Oct. 6, 2020, which is a Continuation of U.S. application Ser. No. 15/843,195 filed Dec. 15, 2017, now U.S. Pat. No. 10,424,347, issued Sep. 24, 2019, which is a Continuation of U.S. application Ser. No. 15/434,748, filed Feb. 16, 2017, now U.S. Pat. No. 9,905,275, issued on Feb. 27, 2018, which is a Continuation of U.S. application Ser. No. 15/090,870, filed Apr. 5, 2016, now U.S. Pat. No. 9,607,665, issued Mar. 28, 2017, which is a Divisional of U.S. application Ser. No. 14/288,618, filed May 28, 2014, now U.S. Pat. No. 9,343,116, issued May 17, 2016, the specifications of which are incorporated herein by reference.

TECHNICAL FIELD

The present disclosure relates generally to semiconductor memory and methods, and more particularly, to providing power availability information to memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory, NOR flash memory, eMultiMediaCard (eMMC) memory, universal flash storage (UFS) memory, and/or wireless memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices may use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell, and the state (e.g., data state) of the memory cell can be determined by sensing the stored charge on the charge storage structure (e.g., the Vt) of the cell.

Memory may consume power (e.g., current at a regulated voltage supply) while operating, such as during program, sense, and/or erase operations performed on the cells of the memory. This power can be provided to the memory by, for example, a host. However, the memory may not be aware of how much (e.g., the maximum amount of) power the host can provide to the memory, and accordingly the memory may not be aware of whether it will have enough power to sustain its present operation. If the memory's power consumption during operation exceeds the amount of power that can be provided by the host, the memory's operation may fail.

DETAILED DESCRIPTION

Figure 1:
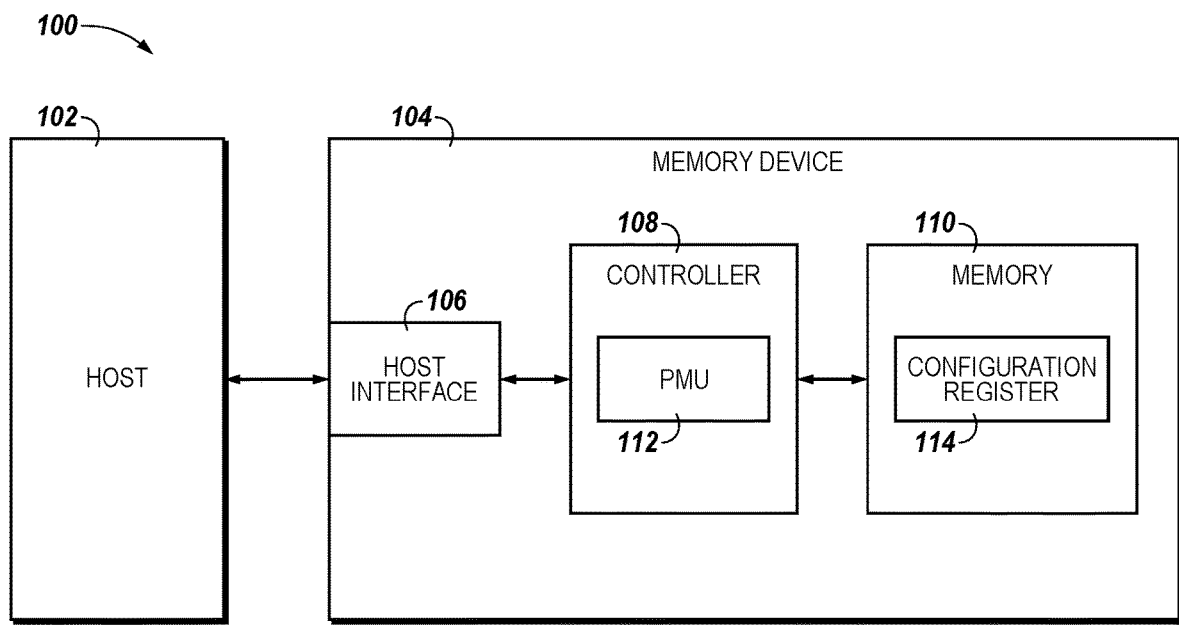
FIG. 1 illustrates a block diagram of a computing system in accordance with a number of embodiments of the present disclosure.

The present disclosure includes apparatuses and methods for providing power availability information to memory. A number of embodiments include a memory and a controller. The controller is configured to provide power and power availability information to the memory, and the memory is configured to determine whether to adjust its operation based, at least in part, on the power availability information.

Providing power availability information to memory in accordance with the present disclosure can inform the memory of whether, and/or the amount of time for which, the memory can continue to operate (e.g., have enough power to continue operating) at its present operating condition (e.g., present power consumption). If the power availability information indicates the memory may not be able to continue to operate at its present operation condition, the memory can adjust its operation accordingly, and thereby avoid failure.

As used herein, "a number of" something can refer to one or more such things. For example, a number of memory cells can refer to one or more memory cells.

The figures herein follow a numbering convention in which the first digit or digits correspond to the drawing figure number and the remaining digits identify an element or component in the drawing. Similar elements or components between different figures may be identified by the use of similar digits.

FIG. 1 illustrates a block diagram of a computing system 100 in accordance with a number of embodiments of the present disclosure. As shown in FIG. 1, computing system 100 can include a host 102 and an apparatus in the form of a memory device 104. As used herein, an "apparatus" can refer to, but is not limited to, any of a variety of structures or combinations of structures, such as a circuit or circuitry, a die or dice, a module or modules, a device or devices, or a system or systems, for example.

Host 102 can include a memory (e.g., a random-access memory (RAM)) and a memory access device (e.g., a processor) (not shown in FIG. 1 so as not to obscure embodiments of the present disclosure). One of ordinary skill in the art will appreciate that "a processor" can intend a number of processors, such as a parallel processing system, a number of coprocessors, etc. Example hosts can include laptop computers, personal computers, digital cameras, digital recording and playback devices, mobile devices (e.g., smart phones, tablets, etc.), PDAs, memory card readers, interface hubs, and the like.

As shown in FIG. 1, memory device 104 can include a host interface 106, a memory 110, and a controller 108 coupled to host interface 106 and memory 110. In a number of embodiments, memory device 104 can be a solid state memory device. Although one memory is shown in FIG. 1, embodiments of the present disclosure are not so limited (e.g., memory device 104 can include more than one memory coupled to controller 108).

Host interface 106 can be used to receive power from host 102, and/or to communicate information (e.g., data) between host 102 and memory device 104. For example, host interface 106 can provide an interface for passing control, address, information (e.g., data), and other signals between memory device 104 and host 102, which can have compatible receptors for host interface 106.

In a number of embodiments, host interface 106 can be a physical host interface, such as a standardized physical interface. For example, when memory device 104 is used for information storage in computing system 100, host interface 106 can be a serial advanced technology attachment (SATA) physical interface, a peripheral component interconnect express (PCIe) physical interface, or a universal serial bus (USB) physical interface, among other physical connectors and/or interfaces. In such embodiments, memory device 104 can receive power from, and/or communicate information with, host 102 through a wired connection with host 102 (e.g., host 102 and memory device 104 can be coupled through a wired connection).

In a number of embodiments, host interface 106 can be a wireless host interface. For example, host interface 106 can include a transceiver and/or antenna that can transmit and/or receive wireless (e.g., over-the-air) signals, such as, for instance, radio frequency (RF) signals. In such embodiments, memory device 104 can receive power from, and/or communicate information with, host 102 through a wireless connection with host 102 (e.g., host 102 and memory device 104 can be wirelessly coupled). For example, in such embodiments, memory device 104 can be a wireless memory tag.

Controller 108 can communicate with memory 110 to sense (e.g., read), program (e.g., write), and/or erase information, among other operations. Controller 108 can include, for example, control circuitry and/or logic (e.g., hardware and/or firmware). For instance, controller 108 can include a power management unit (PMU) 112, as illustrated in FIG. 1. PMU 112 can receive power from host 102 (e.g., through host interface 106), determine power availability information for memory 110, and provide the power and power availability information to memory 110, as will be further described herein. In embodiments in which host interface 106 is a wireless host interface (e.g., in embodiments in which memory device 104 is a wireless memory tag), controller 108 can be an RF control unit.

Controller 108 can be included on the same physical device (e.g., the same die) as memory 110, or can be included on a separate physical device that is communicatively coupled to the physical device that includes memory 110. In a number of embodiments, components of controller 108 can be spread across multiple physical devices (e.g., some components on the same die as memory 110, and some components on a different die, module, or board).

Memory 110 can include, for example, a number of non-volatile memory arrays (e.g., can include a number of non-volatile memory cells). For instance, memory 110 can be flash memory with a NAND architecture. However, embodiments of the present disclosure are not limited to a particular type of memory. For example, in a number of embodiments, memory 110 can be eMultiMediaCard (eMMC) memory, universal flash storage (UFS) memory, and/or wireless memory.

In a NAND architecture, the control gates of memory cells of a "row" can be coupled with an access (e.g., word) line, while the memory cells can be coupled in series source to drain in a "string" between a select gate source transistor and a select gate drain transistor. The string can be connected to a data (e.g., bit) line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory array(s) of memory 110 can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4320 bytes of information per page, 128 pages per block, 2048 blocks per plane, and 16 planes per device.

The embodiment illustrated in FIG. 1 can include additional circuitry that is not illustrated so as not to obscure embodiments of the present disclosure. For example, memory device 104 can include address circuitry to latch address signals provided over I/O connectors through I/O circuitry. Address signals can be received and decoded by a row decoder and a column decoder, to access memory 110 (e.g., the array(s) of memory 110).

In a number of embodiments, controller 108 (e.g., PMU 112) can receive power from host 102 through host interface 106. Controller 108 can receive the power from host 102 through a wired or wireless connection with host 102, as previously described herein. In embodiments in controller 108 receives power from host 102 through a wireless connection, the amount of power controller 108 receives from host 102 may depend on (e.g., vary with) the distance between host 102 and memory device 104. For example, the greater the distance between host 102 and memory device 104, the less power controller 108 may receive from host 102. Further, controller 108 may receive no power from host 102 if memory device 104 is more than a particular distance away from host 102 (e.g., if memory device 104 is outside the wireless range of host 102).

Controller 108 (e.g., PMU 112) can determine power availability information for memory 110. Controller 108 can determine the power availability information based on, for example, the amount of power received from host 102 and the present operating condition of memory 110. The amount of power received from host 102 can correspond to, for example, the maximum current level (e.g., amount of current at a given voltage supply level) controller 108 can provide to memory 110. The present operating condition of memory 110 can include, for example, the present current consumption at the given (e.g., regulated) voltage supply level (e.g., 1.8 Volts) of memory 110 (e.g., the amount of current being consumed by memory 110 during the program, sense, and/or erase operation presently being performed on memory 110).

The power availability information for memory 110 can include, for example, an indication of whether memory 110 can continue to operate at its present operating condition. That is, the power availability information can include an indication of whether controller 108 can continue to provide enough power (e.g., current) to memory 110 for memory 110 to continue operating at its present operating condition (e.g., for the memory to continue its present program, sense, and/or erase operation). For example, the power availability information can include an indication memory 110 can continue to operate at its present operating condition upon controller 108 determining it is receiving enough power from host 102 to continue to provide enough power to memory 110 for it to continue operating at its present operating condition, and the power availability information can include an indication memory 110 can not continue to operate at its present operating condition upon controller 108 determining it is not receiving enough power from host 102 to continue to provide enough power to memory 110 for it to continue operating at its present operating condition.

As an example, the power availability information may include an indication to memory 110 to freeze (e.g., pause) its operation upon the voltage supply being provided to memory 110 by controller 108 reaching (e.g., falling to) a particular (e.g., threshold) level. While the operation of memory 110 is frozen (e.g., while memory 110 is on standby), controller 108 can recover the voltage supply. Once the voltage supply is recovered (e.g., upon controller 108 determining it can provide enough power to memory 110), memory 110 can resume its operation.

As an additional example, the power availability information may include an indication to memory 110 to abort its operation upon controller 108 ceasing to receive power from host 102. Controller 108 may cease to receive power from host 102, for example, upon memory device 104 being turned off (either intentionally or unintentionally), and/or upon memory device 104 being moved outside the wireless range of host 102.

The power availability information for memory 110 may also include an indication of the amount (e.g., period) of time for which memory 110 can continue to operate at its present operating condition. That is, the power availability information can include an indication of how long controller 108 can continue to provide enough power to memory 110 for memory 110 to continue operating at its present operating condition.

For example, the amount of time for which memory 110 can continue to operate at its present operating condition can be the amount of time for which memory 110 can continue its present current consumption before the voltage supply controller 108 provides to memory 110 reaches (e.g., falls to) a particular (e.g., threshold) level. Further, the amount of time can be one of a number of amounts of time. For instance, the amount of time can be unlimited, long, intermediate or short. That is, in such an example, the power availability information may include an indication memory 110 can continue to operate at its present operating condition for an unlimited amount of time, a first (e.g., long) amount of time that is less than the unlimited amount of time, a second (e.g., intermediate) amount of time that is less than the first amount of time, or a third (e.g., short) amount of time that is less than the second amount of time. The different amounts of time may depend on, for example, the characteristics (e.g., technology, architecture, performance, etc.) of memory 110. As an example, the first, second, and third amounts of time can be 75 microseconds, 50 microseconds, and 25 microseconds, respectively. However, embodiments of the present disclosure are not limited to particular amounts of time, or to a particular number of amounts of time.

In a number of embodiments, controller 108 (e.g., PMU 112) can provide power (e.g., the power received from host 102) and the determined power availability information to memory 110. That is, memory 110 can receive power and the determined power availability information from controller 108. For instance, controller 108 can represent the power availability information using a number of binary data values (e.g., bits), and communicate (e.g., send) the data values to memory 110. As an example, in embodiments in which the power availability information includes an indication of whether memory 110 can continue to operate at its present operating condition, an indication memory 110 can continue to operate at its present operating condition can be represented by data value 0, and an indication memory 110 can not continue to operate at its present operating condition can be represented by data value 1.

As an additional example, in embodiments in which the power availability information includes an indication of the amount of time for which memory 110 can continue to operate at its present operating condition, an indication memory 110 can continue to operate at its present operating condition for an unlimited amount of time can be represented by data value 000, an indication memory 110 can continue to operate at its present operating condition for a long amount of time can be represented by data value 001, an indication memory 110 can continue to operate at its present operating condition for an intermediate amount of time can be represented by data value 010, and an indication memory 110 can continue to operate at its present operating condition for a short amount of time can be represented by data value 011. Further, in such embodiments, an indication to memory 110 to freeze its operation can be represented by data value 100, 101, or 110, and in indication to memory 110 to abort its operation can be represented by data value 111. However, embodiments of the present disclosure are not limited to particular data values or combinations of data values.

In the embodiment illustrated in FIG. 1, memory 110 includes a configuration register 114. In such an embodiment, controller 108 can provide the power availability information to memory 110 through configuration register 114. As an additional example, controller 108 can provide the power availability information to memory 110 through a number of interface signals (e.g., address signals, data signals, etc.).

In a number of embodiments, memory 110 can determine whether to adjust its operation based, at least in part, on the power availability information received from controller 108. For example, memory 110 can continue to operate at its present operating condition (e.g., continue its present program, sense, and/or erase operation) upon the power availability information including an indication memory 110 can continue to operate at its present operating condition, and memory 110 can cease operating at its present operating condition (e.g., abort or freeze its present program, sense, and/or erase operation) upon the power availability information including an indication memory 110 can not continue to operate at its present operating condition. As an additional example, upon the power availability information including an indication memory 110 can continue to operate at its present operating condition for an amount of time, memory 110 can continue to operate at its present operating condition for the amount of time.

Controller 108 can continue to determine and provide power availability information to memory 110 during operation of memory device 104. For example, controller 108 can determine and provide additional (e.g., updated) power availability information to memory 110 upon (e.g., based on) a change in the amount of power received from host 102, and/or upon a change in the operating condition of memory 110. That is, controller 108 can determine and provide additional power availability information to memory 110 upon a change in the maximum current level at a given voltage supply controller 108 can provide to memory 110, and/or upon a change in current consumption by (e.g., the current consumption level of) memory 110. Further, controller 108 can determine and provide additional power availability information to memory 110 upon the voltage supply that controller 108 provides to memory 110 reaching (e.g., falling to) a particular (e.g., threshold) level. The additional power availability information can include, for example, an indication of whether, and/or the amount of time for which, memory 110 can continue to operate at its present operating condition, in a manner analogous to the power availability information previously described herein. Upon receiving the additional power availability information, memory 110 can determine whether to adjust its operation based, at least in part, on the additional power availability information, in a manner analogous to that previously described herein.

Figure 2:
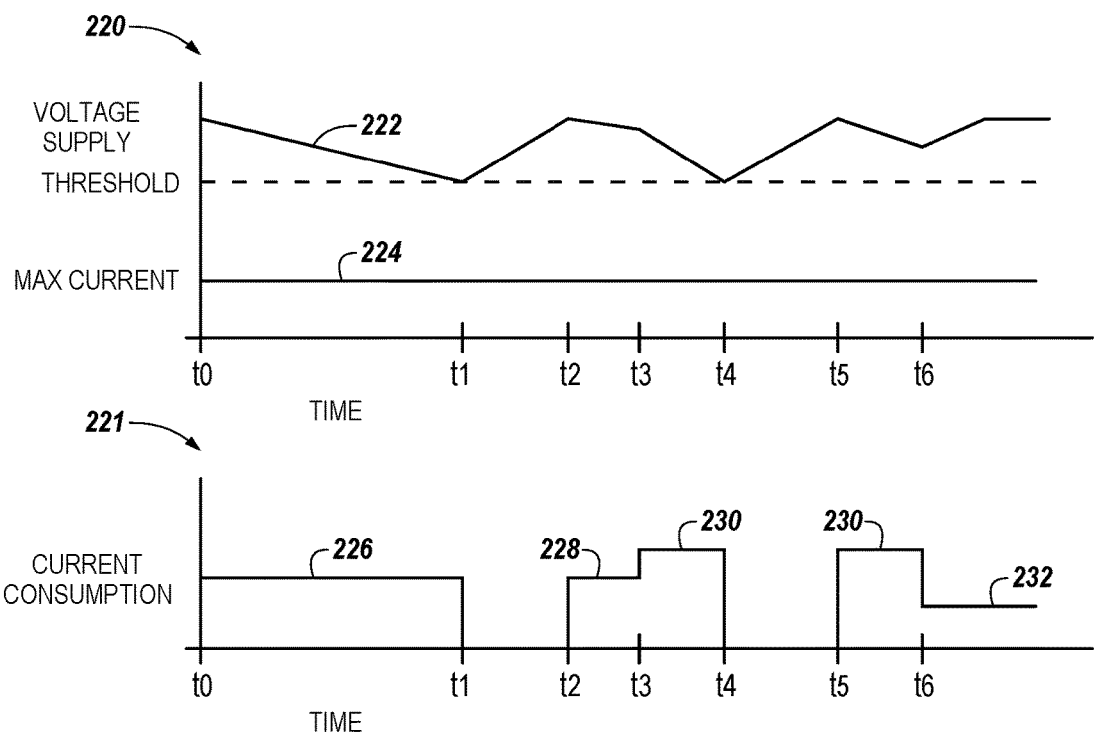
FIG. 2 illustrates an example of timing diagrams associated with providing power availability information to memory in accordance with a number of embodiments of the present disclosure.

FIG. 2 illustrates an example of timing diagrams 220 and 221 associated with providing power availability information to memory in accordance with a number of embodiments of the present disclosure. The memory can be, for example, memory 110 previously described in connection with FIG. 1.

As shown in FIG. 2, timing diagram 220 includes waveform 222, which represents the amount of voltage supply a controller in communication with the memory (e.g., controller 108 previously described in connection with FIG. 1) is providing (e.g., supplying) to the memory during operation of the memory. Timing diagram 220 also includes waveform 224, which represents the maximum current level at a given voltage supply (e.g., 1.8 Volts) the controller can provide to the memory during the operation of the memory. The maximum current level at the given voltage supply can correspond to the amount of power the controller receives from a host, as previously described herein (e.g., in connection with FIG. 1). In the example illustrated in FIG. 2, the maximum current level at the given voltage supply remains constant (e.g., the same) throughout the operation of the memory. As shown in FIG. 2, timing diagram 221 includes waveform 226, which represents the current consumption by the memory during the operation of the memory.

At initial time t0 in the example illustrated in FIG. 2, the current consumption at the given voltage supply by the memory is at a higher level than the maximum current level at the given voltage supply the controller can provide to the memory. For instance, the current consumption by the memory at time t0 may be 50 milliamps (mA), but the maximum current level at the given voltage supply the controller can provide to the memory at time t0 may only be 25 mA. As such, the controller may provide power availability information to the memory that indicates the memory can only continue to operate at its present operating condition (e.g., its present current consumption level) for a particular amount of time before the voltage supply the controller provides to the memory reaches (e.g., falls to) the threshold level illustrated in FIG. 2. The particular amount of time can be, for example, one of a number of amounts of time, such as, for instance, a long amount of time, as previously described herein (e.g., in connection with FIG. 1). In response to receiving the power availability information from the controller, the memory may continue to operate at its present operating condition (e.g., may continue to consume 50 mA of current) for the particular amount of time (e.g., from time t0 to time t1), as illustrated in FIG. 2.

At time t1, the voltage supply being provided to the memory by the controller reaches the threshold level, as illustrated in FIG. 2. As such, the controller may provide power availability information to the memory that includes an indication to the memory to freeze (e.g., pause) its operation. In response to receiving this power availability information, the memory may freeze its operation (e.g., move to standby and/or consume no current) at time t1, as illustrated in FIG. 2. While the operation of the memory is frozen (e.g., from time t1 to time t2), the controller can recover its voltage supply, as illustrated in FIG. 2.

At time t2, the voltage supply of the controller has been fully recovered, and the memory has resumed its operation at current consumption level 228 (e.g., 50 mA), as illustrated in FIG. 2. As such, the controller may again provide power availability information to the memory that indicates the memory can only continue to operate at its present operating condition for the particular amount of (e.g., long) time before the voltage supply the controller provides to the memory reaches the threshold level. In response to receiving the power availability information from the controller, the memory may continue to operate at its present operating condition, as illustrated in FIG. 2.

At time t3, the memory has increased its current consumption to level 230 (e.g., 70 mA), as illustrated in FIG. 2. This increase may be a result of, for example, a change in the operation of (e.g., being performed on) the memory. As a result of this increase, the controller may provide power availability information to the memory that indicates the memory can only continue to operate at that operating condition (e.g., current consumption level 230) for a shorter amount of time before the voltage supply the controller provides to the memory reaches the threshold level. The shorter amount of time can be a different one of the amounts of time, such as, for instance, a short amount of time, as previously described herein. In response to receiving this power availability information from the controller, the memory may continue to operate at its present operating condition (e.g., may continue to consume 70 mA of current) for the shorter amount of time (e.g., from time t3 to time t4), as illustrated in FIG. 2.

At time t4, the voltage supply being provided to the memory by the controller reaches the threshold level, as illustrated in FIG. 2. As such, the controller may provide power availability information to the memory that includes an indication to the memory to freeze its operation. In response to receiving this power availability information, the memory may freeze its operation at time t4, as illustrated in FIG. 2. While the operation of the memory is frozen (e.g., from time t4 to time t5), the controller can recover its voltage supply, as illustrated in FIG. 2.

At time t5, the voltage supply of the controller has been fully recovered, and the memory has resumed its operation at current consumption level 230 (e.g., 70 mA) at the given voltage supply, as illustrated in FIG. 2. As such, the controller may again provide power availability information to the memory that indicates the memory can only continue to operate at its present operating condition for the shorter time before the voltage supply the controller provides to the memory reaches the threshold level. In response to receiving this power availability information from the controller, the memory may continue to operate at its present operating condition, as illustrated in FIG. 2.

At time t6, the memory has decreased its current consumption at the given voltage supply to level 232 (e.g., 20 mA), as illustrated in FIG. 2, which is below (e.g., less than) the maximum current level (e.g., 25 mA) at the given voltage supply the controller can provide to the memory. This decrease may be a result of, for example, a change in the operation of (e.g., being performed on) the memory As a result of this decrease, the controller may provide power availability information to the memory that indicates the memory can continue to operate at its present operating condition for an unlimited amount of time. In response to receiving this power availability information from the controller, the memory may continue to operate at its present operating condition (e.g., may continue to consume 20 mA of current), as illustrated in FIG. 2.

Figure 3:
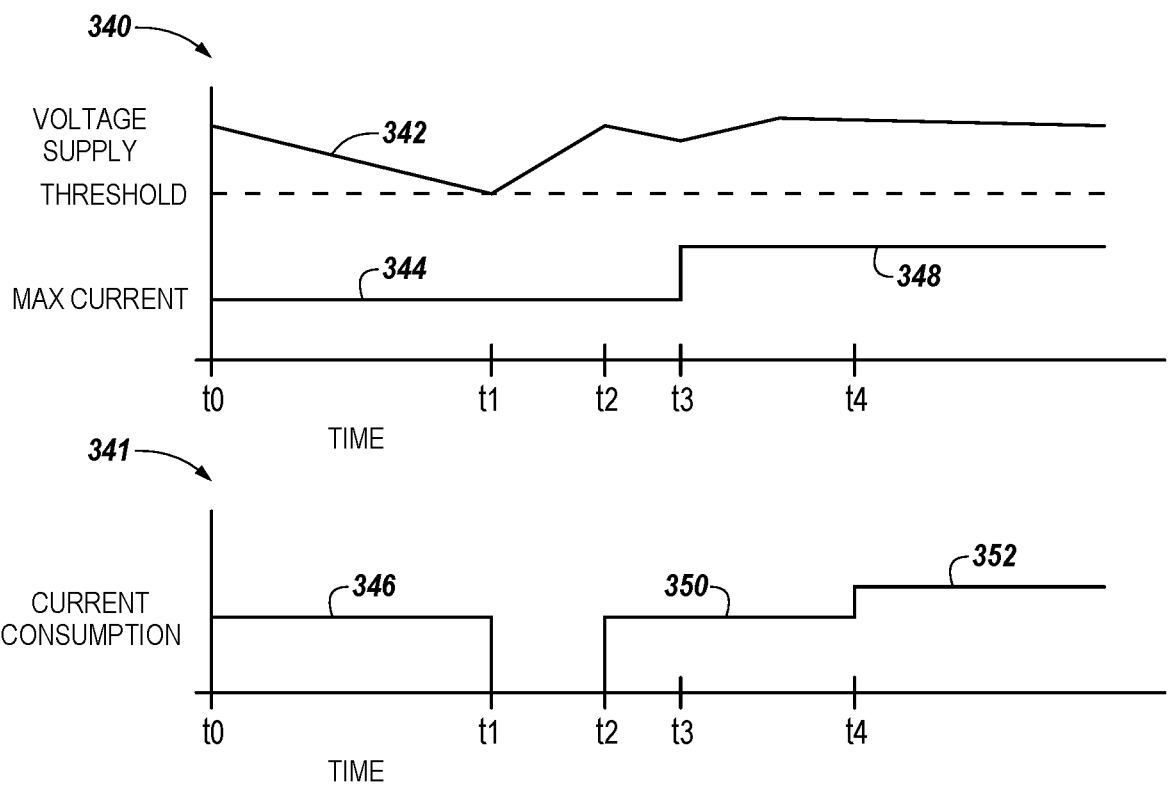
FIG. 3 illustrates an example of timing diagrams associated with providing power availability information to memory in accordance with a number of embodiments of the present disclosure.

FIG. 3 illustrates an example of timing diagrams 340 and 341 associated with providing power availability information to memory in accordance with a number of embodiments of the present disclosure. The memory can be, for example, memory 110 previously described in connection with FIG. 1.

As shown in FIG. 3, timing diagram 340 includes waveform 342, which represents the amount of voltage supply a controller in communication with the memory (e.g., controller 108 previously described in connection with FIG. 1) is providing (e.g., supplying) to the memory during operation of the memory. Timing diagram 340 also includes waveform 344, which represents the maximum current level at a given voltage supply (e.g., 1.8 Volts) the controller can provide to the memory during the operation of the memory. The maximum current level at the given voltage supply can correspond to the amount of power the controller receives from a host, as previously described herein (e.g., in connection with FIG. 1). As shown in FIG. 3, timing diagram 341 includes waveform 346, which represents the current consumption by the memory during the operation of the memory. From initial time t0 to time t3 in the example illustrated in FIG. 3, timing diagrams 340 and 341 can be analogous to timing diagrams 220 and 221, respectively, previously described in connection with FIG. 2 from initial time t0 to time t3.

At time t3, the maximum current level at the given voltage supply the controller can provide to the memory has increased to level 348 (e.g., 100 mA), as illustrated in FIG. 3, which is above (e.g., greater than) the current consumption by the memory at time t3 (e.g., current consumption level 350). This increase may be a result of, for example, the memory and/or controller being moved closer to the host in embodiments in which the controller receives power from the host through a wireless connection. As a result of this increase, the controller may provide power availability information to the memory that indicates the memory can continue to operate at its present operating condition for an unlimited amount of time. In response to receiving this power availability information from the controller, the memory may continue to operate at its present operating condition (e.g., current consumption level 350), as illustrated in FIG. 3.

At time t4, the memory has increased its current consumption at the given voltage supply to level 352 (e.g., 70 mA), as illustrated in FIG. 3. This increase may be a result of, for example, a change in the operation of (e.g., being performed on) the memory. However, because this increase does not result in the memory's current consumption at the regulated voltage supply exceeding the maximum current level the controller can provide to the memory at time t4 (e.g., 100 mA), no additional (e.g., updated) power availability information may be provided to the memory by the controller, and the memory may continue to operate at its present operating condition (e.g., current consumption level 352), as illustrated in FIG. 3.

Figure 4:
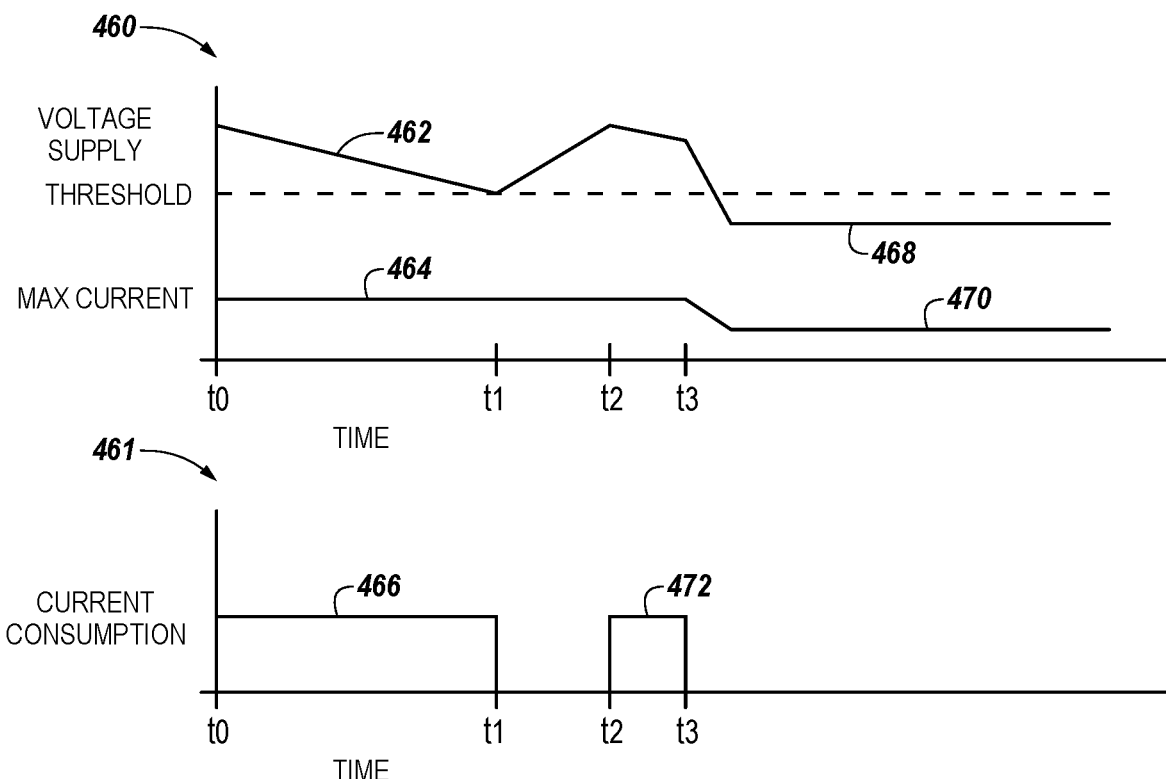
FIG. 4 illustrates an example of timing diagrams associated with providing power availability information to memory in accordance with a number of embodiments of the present disclosure.

FIG. 4 illustrates an example of timing diagrams 460 and 461 associated with providing power availability information to memory in accordance with a number of embodiments of the present disclosure. The memory can be, for example, memory 110 previously described in connection with FIG. 1.

As shown in FIG. 4, timing diagram 460 includes waveform 462, which represents the amount voltage supply a controller in communication with the memory (e.g., controller 108 previously described in connection with FIG. 1) is providing (e.g., supplying) to the memory during operation of the memory. Timing diagram 460 also includes waveform 464, which represents the maximum current level at a given voltage supply the controller can provide to the memory during the operation of the memory. The maximum current level at the given voltage supply can correspond to the amount of power the controller receives from a host, as previously described herein (e.g., in connection with FIG. 1). As shown in FIG. 4, timing diagram 461 includes waveform 466, which represents the current consumption by the memory during the operation of the memory. From initial time t0 to time t3 in the example illustrated in FIG. 4, timing diagrams 460 and 461 can be analogous to timing diagrams 220 and 221, respectively, previously described in connection with FIG. 2 from initial time t0 to time t3.

At time t3 in the example illustrated in FIG. 4, the controller has ceased to receive power from the host. As such, the amount of power being provided to the memory by the controller and the maximum current level at the voltage supply the controller can provide to the memory decrease to levels 468 and 470 (e.g., zero), respectively, as shown in FIG. 4. Further, upon the controller ceasing to receive power from the host, the controller may provide power availability information to the memory that includes an indication to the memory to abort its operation. In response to receiving this power availability information, the memory may abort its operation (e.g., reduce its current consumption from level 472 to zero) at time t3, as illustrated in FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving signaling that indicates an amount of time until a memory device will cease receiving power from a host, wherein the amount of time comprises:
   an unlimited amount of time;
   a first amount of time that is less than the unlimited amount of time;
   a second amount of time that is less than the first amount of time; or
   a third amount of time that is less than the second amount of time; and
   continuing to operate the memory device in its present operating condition for the amount of time indicated by the signaling, while the host waits for a communication from the memory device on an interface between the host and the memory device.

2. The method of claim 1, wherein the method includes receiving additional signaling that indicates that the host will keep power active at the memory device to support the present operating condition of the memory device.

3. The method of claim 2, wherein the method includes receiving the additional signaling through a configuration register of the memory device.

4. The method of claim 1, wherein the method includes continuing to operate the memory device in its present operating condition after the amount of time ends.

5. The method of claim 1, wherein the signaling indicates a maximum power level from the host has increased.

6. The method of claim 1, wherein the power received from the host depends on a distance between the host and the memory device.

7. An apparatus, comprising:
   a memory; and
   a controller configured to continue, while a host waits for a communication from the apparatus on an interface between the host and the apparatus, to operate the apparatus in its present operating condition for an amount of time that is based at least in part on signaling from the host that indicates an amount of time until the memory will cease to receive power from the host, wherein the amount of time until the memory will cease to receive power from the host comprises:
   an unlimited amount of time;
   a first amount of time that is less than the unlimited amount of time;
   a second amount of time that is less than the first amount of time; or
   a third amount of time that is less than the second amount of time.

8. The apparatus of claim 7, wherein the apparatus includes a configuration register configured to receive additional signaling that indicates that the host will keep power active at the memory to support the present operating condition of the apparatus.

9. The apparatus of claim 7, wherein the controller is configured to change the present operating condition of the apparatus before the amount of time until the memory will cease to receive power from the host ends.

10. The apparatus of claim 7, wherein the memory comprises a non-volatile memory array.

11. A method, comprising:
    transmitting signaling that indicates an amount of time until a memory device will cease receiving power from a host, wherein the amount of time comprises:
    an unlimited amount of time;
    a first amount of time that is less than the unlimited amount of time;
    a second amount of time that is less than the first amount of time; or
    a third amount of time that is less than the second amount of time; and
    monitoring an interface between the host and the memory device for a communication that indicates that the memory device is continuing to operate in its present operating condition for the amount of time indicated by the signaling.

12. The method of claim 11, wherein the method includes transmitting the signaling from the host to the memory device.

13. The method of claim 11, wherein the method includes transmitting the signaling through the interface.

14. The method of claim 11, wherein the method includes transmitting additional signaling that indicates that the host will keep power active at the memory device to support the present operating condition of the memory device.

15. The method of claim 11, wherein the method includes monitoring the interface for a communication that indicates that the memory device is continuing to operate in its present operating condition after the amount of time ends.

16. The method of claim 11, wherein the method includes monitoring the interface for a communication that indicates that the memory device has changed its operating condition before the amount of time ends.

17. The method of claim 11, wherein the method includes transmitting the power from the host to the memory device through the interface.

* * * * *